(12) United States Patent
Yamamoto et al.

(10) Patent No.: US 8,207,452 B2
(45) Date of Patent: Jun. 26, 2012

(54) MULTILAYER INTERCONNECTION BOARD

(75) Inventors: Issey Yamamoto, Ritto (JP); Akihiko Kamada, Yasu (JP)

(73) Assignee: Murata Manufacturing Co., Ltd., Kyoto (JP)

(*) Notice: Subject to any disclaimer, the term of this patent is extended or adjusted under 35 U.S.C. 154(b) by 264 days.

(21) Appl. No.: 12/466,604

(22) Filed: May 15, 2009

(65) Prior Publication Data

US 2009/0218123 A1   Sep. 3, 2009

Related U.S. Application Data

(63) Continuation of application No. PCT/JP2007/072340, filed on Nov. 19, 2007.

(30) Foreign Application Priority Data

Dec. 19, 2006   (JP) .................................. 2006-340733

(51) Int. Cl.
  *H05K 1/11*   (2006.01)
(52) U.S. Cl. ........................................................ 174/262
(58) Field of Classification Search .................. 174/250, 174/255, 260, 262, 264
  See application file for complete search history.

(56) References Cited

U.S. PATENT DOCUMENTS

| | | | |
|---|---|---|---|
| 5,677,576 A * | 10/1997 | Akagawa | ...................... 257/785 |
| 5,700,549 A | 12/1997 | Garant et al. | |
| 6,399,897 B1 | 6/2002 | Umematsu et al. | |
| 6,515,237 B2 * | 2/2003 | Kikuchi et al. | ................ 174/261 |
| 7,829,190 B2 * | 11/2010 | Cobbley et al. | .......... 428/402.24 |
| 2002/0185308 A1 * | 12/2002 | Cornelius et al. | ............. 174/260 |

FOREIGN PATENT DOCUMENTS

| | | |
|---|---|---|
| JP | 07-015144 A | 1/1995 |
| JP | 10-065286 A | 3/1998 |
| JP | 2001-077543 A | 3/2001 |
| JP | 2004-071852 A | 3/2004 |
| JP | 2004-172260 A | 6/2004 |
| JP | 2004-228492 A | 8/2004 |

OTHER PUBLICATIONS

Official Communication issued in International Patent Application No. PCT/JP2007/072340, mailed on Feb. 19, 2008.

Official Communication issued in corresponding Japanese Patent Application No. 2008-550067, mailed on Aug. 16, 2011.

* cited by examiner

*Primary Examiner* — Jeremy Norris
*Assistant Examiner* — Tremesha S Willis
(74) *Attorney, Agent, or Firm* — Keating & Bennett, LLP

(57) ABSTRACT

A multilayer interconnection board includes a plurality of laminated ceramic layers. Wiring electrodes are disposed on principal surfaces of the ceramic layers, and dot patterns are arranged around the wiring electrodes. The dot patterns are arranged such that the density distribution thereof is varied such that the ratio of the presence of the dot patterns in the vicinity of the wiring electrode is relatively large and the ratio of the presence is reduced as the distance from the wiring electrode increases.

16 Claims, 8 Drawing Sheets

PRIMARY PARTICLE

SECONDARY PARTICLE

MULTILAYER INTERCONNECTION BOARD

BACKGROUND OF THE INVENTION

1. Field of the Invention

The present invention relates to a multilayer interconnection board. In particular, the present invention relates to a multilayer interconnection board arranged to incorporate, for example, electronic components and to include electronic circuits.

2. Description of the Related Art

Multilayer interconnection boards have been previously used to incorporate electronic components and to include electronic circuits. The multilayer interconnection board includes a plurality of laminated ceramic layers and wiring electrodes disposed on principal surfaces of the ceramic layers. Furthermore, via holes are disposed in the ceramic layers in order to connect the wiring electrodes disposed on the principal surfaces of the ceramic layers. Such a multilayer interconnection board is formed by laminating ceramic green sheets provided with wiring electrode patterns and firing the laminate. In such a multilayer interconnection board, a stress caused by a difference in heat shrinkage between the ceramic layer and the wiring electrode or the via hole may be generated during the firing and, thereby, cracking of the ceramic layer may occur. In particular, frequencies of electronic components have increased and the film thickness of the wiring electrode has been increased in order to reduce an insertion loss in a high-frequency region. However, if the film thickness of the wiring electrode is increased, a difference in shrinkage between the wiring electrode, which is a metal material, and the ceramic during the firing becomes significant. Furthermore, warping or deformation of the multilayer interconnection board may occur after the firing.

A multilayer interconnection board as shown in FIG. 17 has been described. The multilayer interconnection board 1 includes a plurality of laminated ceramic layers 2. A via hole 3 is disposed in the ceramic layers 2. Stress release pads 4 having substantially the same size as that of the via hole 3 are disposed in the vicinity of the via hole 3. The stress release pads 4 are defined by concave portions in the ceramic green sheet and that are filled with an electrically conductive paste. When the stress release pads 4 are provided, a stress caused by a difference in heat shrinkage between the via hole 3 and the ceramic layer 2 is redistributed and cracking and warping of the ceramic layer 2 can be prevented. Furthermore, since the stress release pad 4 does not penetrate the ceramic layer 2, a wiring electrode 5 can be provided as a layer under the portions in which the stress release pads 4 are disposed (see, for example, Japanese Unexamined Patent Application Publication No. 10-65286).

However, when the above-described stress release pads are included in the multilayer interconnection board, the stress release pads 4 having substantially the same size as that of the via hole are used. Therefore, the locations at which the stress release pads can be provided are limited. Furthermore, since the size of the stress release pad is relatively large, when the stress release pads are provided, the locations at which the wiring electrode and the via hole can be arranged are limited, and flexibility of the design is reduced.

Moreover, in order to form the stress release pads, concave portions must be formed in the ceramic green sheet but not to penetrate the ceramic green sheet, and the resulting concave portions must be filled with the electrically conductive paste. Consequently, the production process becomes very complicated. Furthermore, in production of the via hole and the stress release pads, it is necessary that the via hole and the stress release pads are disposed at a distance from each other. Consequently, flexibility of the design is reduced. In addition, since the stress release pads are relatively large, the unnecessary portions of the product are increased so as to increase the size and cost of the multilayer interconnection board.

SUMMARY OF THE INVENTION

To overcome the problems described above, preferred embodiments of the present invention provide a multilayer interconnection board, wherein the flexibility of design is improved, cracking and warping do not readily occur during production, and the production can be conducted inexpensively.

A multilayer interconnection board according to a preferred embodiment of the present invention includes a plurality of laminated ceramic layers, wiring electrodes disposed on principal surfaces of the ceramic layers, and dot patterns defined by a plurality of dots that are scattered in the vicinity of the wiring electrodes on the principal surfaces of the ceramic layers.

Preferably, the density distribution of the dot patterns is varied.

A difference in heat shrinkage between the wiring electrode and the ceramic layer is decentralized and reduced by the plurality of dot patterns scattered in the vicinity of the wiring electrode. Consequently, during firing of the laminated ceramic green sheets, a stress applied to the ceramic layers can be reduced.

By varying the density distribution of the dot patterns, the heat shrinkage can be concentrated towards the dot pattern side or towards the ceramic layer side based on a portion in which the density of dot patterns is relatively high and a portion in which the density of dot patterns is relatively low. To form the dot patterns, a material from which the dot patterns are made may be disposed on the ceramic green sheet by printing or other suitable method, and there is no need to form concave portions in the ceramic green sheet.

In the above-described multilayer interconnection board, the density distribution of the dot patterns can preferably be varied such that the ratio of the dot patterns in the vicinity of the wiring electrode is relatively large and the ratio of the dot patterns is reduced as the distance from the wiring electrode increases.

The density distribution of the dot patterns may preferably be varied such that the dot patterns are smaller as the distance from the wiring electrode increases.

Furthermore, the density distribution of the dot patterns may preferably be varied such that the number of dot patterns is reduced as the distance from the wiring electrode increases.

Regarding the density distribution of the dot patterns, it is preferable that the density is relatively high in the vicinity of the wiring electrode and that the density is reduced as the distance from the wiring electrode increases. Consequently, the heat shrinkage can be gradually varied as the distance from the wiring electrode increases. In order to vary the density distribution of the dot patterns, the ratio of the dot patterns is preferably varied. For that purpose, the sizes of dot patterns may be changed or the number of dot patterns may be changed in accordance with the distance from the wiring electrode.

Furthermore, the dot patterns are disposed on the same layer as that of the wiring electrode.

The dot patterns may be made of the same material as that of the wiring electrode.

Moreover, the dot patterns may be made of a material that is different from the material of the wiring electrode.

A stress caused by a difference in heat shrinkage between the wiring electrode and the ceramic layer can be reduced by providing the dot patterns on the same layer as that of the wiring electrode. In addition, during the production of the multilayer interconnection board, the dot patterns can be formed on the ceramic green sheet at the same time that the wiring electrode is formed or the dot patterns can be formed independently of the wiring electrode. Consequently, various methods can be used as the method for manufacturing the dot patterns. Furthermore, changes in the characteristics of the multilayer interconnection board itself caused by the dot patterns can be minimized by not disposing any dot patterns in the inside of the ceramic layer.

Here, the dot patterns may be made of the same material as that for the wiring electrode or the dot patterns may be made of a material that is different from the material for the wiring electrode depending on the state of change in the heat shrinkage and other required characteristics.

Moreover, when a via hole is disposed in the ceramic layers, it is preferable that the areas of individual dot patterns are less than the area of the via hole.

When the dot patterns are small, the dot patterns can be arranged in gaps between the wiring electrode and the via hole. Therefore, there is no need for a specific design to accommodate the dot patterns.

Furthermore, when the via hole is disposed in the ceramic layers, the dot patterns may preferably be connected to the via hole.

In addition, a side surface electrode may be disposed on a side surface of the ceramic layers laminated, and the dot patterns may preferably be connected to the side surface electrode.

When the dot patterns are used for thermal conduction, the heat in the inside of the board can preferably be dissipated through the via hole and the side surface electrode by connecting the dot patterns to the via hole and the side surface electrode.

Moreover, a ground electrode may preferably be provided and the dot patterns may preferably be connected to the ground electrode.

The dot patterns can be used for electromagnetic shielding by connecting the dot patterns to the ground electrode. Consequently, electromagnetic coupling between adjacent elements and wiring electrodes can be effectively prevented.

In addition, it is preferable that the two-dimensional shape of the dot pattern is substantially circular.

The stress caused by the difference in heat shrinkage concentrates on a corner portion of materials having different heat shrinkages. Therefore, the stress applied to the board can preferably be reduced by selecting the two-dimensional shape of the dot pattern to be a substantially round shape, e.g., a circle or an ellipse, for example.

Moreover, it is preferable that the value of heat shrinkage of the dot pattern is between the heat shrinkage of the ceramic layer and the heat shrinkage of the wiring electrode.

When the value of heat shrinkage of the dot pattern is between the heat shrinkage of the ceramic layer and the heat shrinkage of the wiring electrode, the stress caused by the difference in heat shrinkage between the wiring electrode and the ceramic layer can be reduced and an occurrence of cracking or other defects during firing can be prevented.

Furthermore, the dot patterns may preferably be formed by a screen printing method, for example.

Alternatively, the dot patterns may preferably be formed by an ink-jet printing method, for example.

Alternatively, the dot patterns may preferably be formed by an electrophotographic printing method, for example.

Thus, the dot patterns can be formed by various methods. The dot patterns may be formed by the same method as that for the wiring electrode or by a method that is different from that for the wiring electrode.

According to various preferred embodiments of the present invention, in the production of the multilayer interconnection board by firing a ceramic green sheet laminate, the stress caused by the difference in heat shrinkage between the wiring electrode and the ceramic layer can be reduced by the dot patterns and the occurrence of cracking in the ceramic layer or the occurrence of warping of the board can be prevented. Furthermore, the dot patterns can also be used for heat dissipation and electromagnetic shielding. In addition, since the dot patterns can be relatively small, the dot patterns can be arranged in gaps between the wiring electrode and the via hole. Therefore, the locations at which the wiring electrode and the via hole are arranged are not specifically limited, and the flexibility of design of the multilayer interconnection board can be improved. In addition, there is no need to form concave portions in the ceramic green sheet in order to form the dot patterns and, therefore, the multilayer interconnection board is easily produced.

Other features, elements, arrangements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
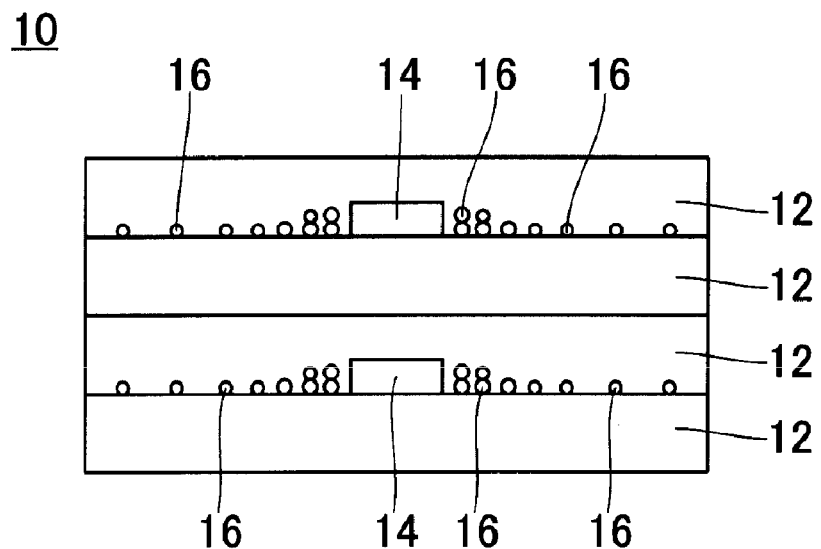
FIG. 1 is a sectional view showing of a multilayer interconnection board according to a preferred embodiment of the present invention.
Figure 2:
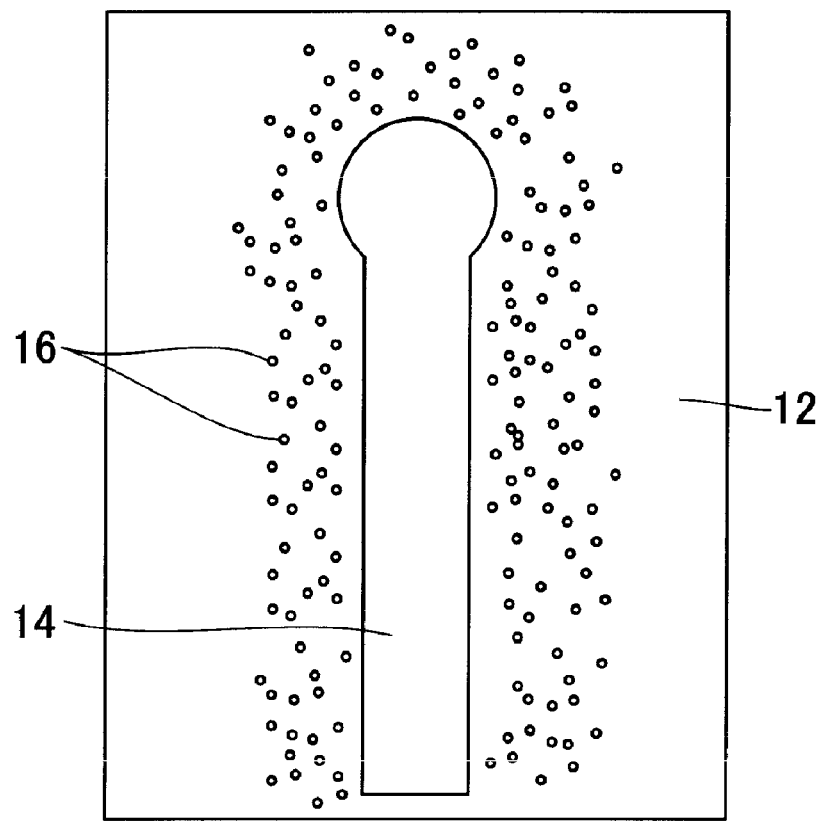
FIG. 2 is a plan view showing an example of a ceramic layer of the multilayer interconnection board shown in FIG. 1.
Figure 3:
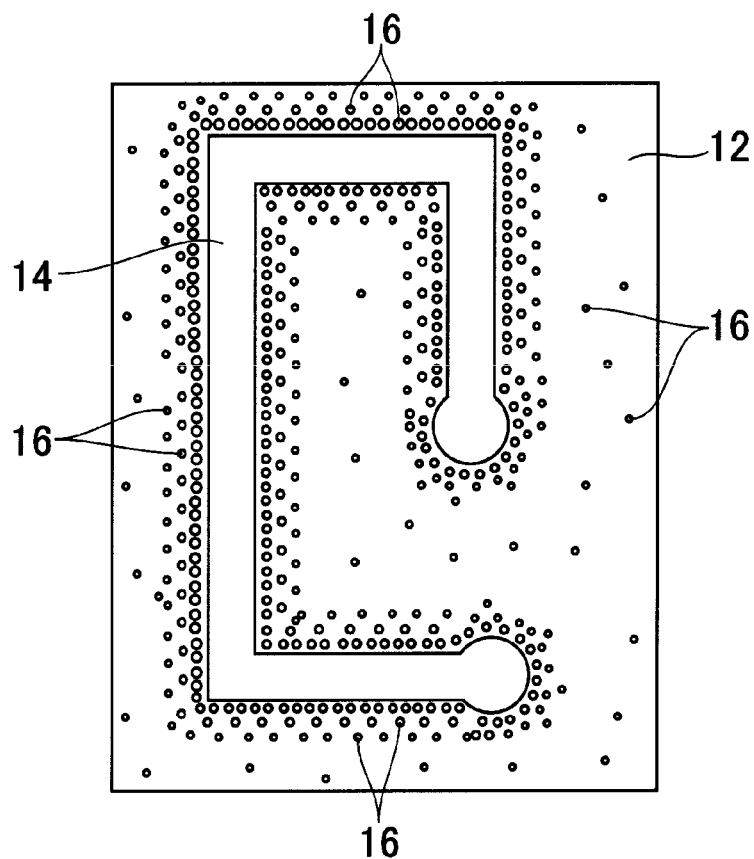
FIG. 3 is a plan view showing another example of a ceramic layer of the multilayer interconnection board shown in FIG. 1.

FIG. 1 is a sectional view showing a multilayer interconnection board according to a preferred embodiment of the present invention. FIG. 2 and FIG. 3 are plan views showing a ceramic layer of the multilayer interconnection board shown in FIG. 1. A multilayer interconnection board 10 includes a plurality of ceramic layers 12. Wiring electrodes 14 are disposed on principal surfaces of the ceramic layers 12. As shown in FIG. 2, a plurality of dot patterns 16 are disposed around the wiring electrode 14. The dot patterns 16 are preferably configured in the shape of small dots from, for example, the same material as that for the wiring electrode 14.

Preferably, the dot patterns 16 are arranged such that the density thereof is relatively high in the vicinity of the wiring electrode 14 and the density thereof is reduced as the distance from the wiring electrode 14 increases, as shown in FIG. 3. In order to vary the density distribution of the dot patterns 16, for example, as shown in FIG. 1, the number of the dot patterns 16 can be varied in a thickness direction of the ceramic layer 12. For example, a plurality of dot patterns 16 are preferably stacked in the vicinity of the wiring electrode 14, the number of stacking of dot patterns 16 is reduced as the distance from the wiring electrode 14 increases and, thereby, the density distribution of the dot patterns 16 can be varied.

Alternatively, as shown in FIG. 3, the density distribution of the dot patterns 16 can be varied by varying the number of the dot patterns 16 in a plane of the ceramic layer 12. For example, in the plane of the ceramic layer 12, the ratio of the dot patterns 16 in the vicinity of the wiring electrode 14 is preferably relatively large, and the ratio of the dot patterns 16 is reduced as the distance from the wiring electrode 14 increases. Consequently, the density distribution of the dot patterns 16 can be varied.

Furthermore, the density distribution of the dot patterns 16 may be varied by varying the sizes of the dot patterns 16 while the ratio of the dot patterns 16 is maintained substantially constant. For example, the density distribution of the dot patterns 16 can preferably be varied by setting the sizes of the dot patterns 16 in the vicinity of the wiring electrode 14 to be relatively large and setting the sizes of the dot patterns 16 to be smaller as the distance from the wiring electrode 14 increases.

In this regard, the variation in the ratio of the dot patterns 16 and the variation in the sizes of the dot patterns 16 may preferably be used together. However, the density distribution can be varied by varying the ratio of the dot patterns 16 while the sizes of all of the dot patterns 16 are set to be substantially equal. Alternatively, the density distribution can be varied by varying the sizes of dot patterns 16 while the ratio of the dot patterns 16 is not varied.

Figure 4:
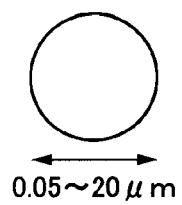
FIG. 4 is a diagram showing a primary particle included in ink used for ink-jet printing or included in toner used for electrophotographic printing.
Figure 5:
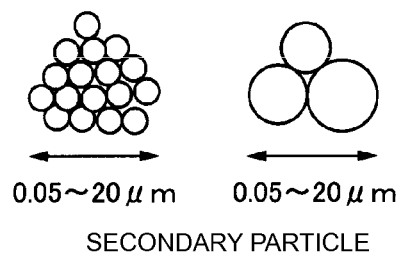
FIG. 5 is a diagram showing a secondary particle included in ink used for ink-jet printing or included in toner used for electrophotographic printing.

The multilayer interconnection board 10 is preferably formed by forming the wiring electrodes 14 and the dot patterns 16 from an electrically conductive material or other suitable material on ceramic green sheets, laminating the resulting ceramic green sheets, and firing the laminated ceramic green sheets, for example. The formation of the patterns on the ceramic green sheets is preferably performed by applying an electrically conductive material by, for example, a screen printing method, an ink-jet printing method, or an electrophotographic printing method, for example. At this time, the wiring electrode 14 and the dot patterns 16 may be formed using the same method or different methods. When different methods are used, for example, a method in which the wiring electrode 14 is formed by the screen printing method and the dot patterns 16 are formed by the ink-jet printing method on the ceramic green sheet can preferably be used. When the degree of dispersion of ink used in the ink-jet printing is relatively high and when the fluidity of toner used in the electrophotographic printing is relatively high, the wiring electrode 14 and the dot patterns 16 can preferably be formed using of a single type of primary particle, as shown in FIG. 4. Consequently, as the particle diameter of the primary particle is reduced, a finer wiring electrode 14 and finer dot patterns 16 can be formed. Furthermore, when the degree of dispersion of ink is relatively low and when the fluidity of toner is relatively low, secondary particles, as shown in FIG. 5, which are aggregates of the primary particles are provided, and printing is preferably performed using the primary particles and the secondary particles.

The multilayer interconnection board 10 is produced by laminating ceramic green sheets provided with these patterns and firing the laminated ceramic green sheets. At this time, the heat shrinkage of the wiring electrode 14 and the dot patterns 16 and the heat shrinkage of the ceramic layer 12 are different from each other, and a stress occurs due to this difference. However, since fine dot patterns 16 are scattered on the ceramic layer 12, the stress applied between the wiring electrode 14 and the ceramic layer 12 is decentralized. That is, in the vicinity of the wiring electrode 14, the density of the dot patterns 16 is relatively high and, therefore, the value of heat shrinkage is similar to that of the wiring electrode 14. Furthermore, since the density of the dot patterns 16 decreases as the distance from the wiring electrode 14 increases, the value of heat shrinkage becomes similar to that of the ceramic layer 12. Consequently, when the ceramic green sheet laminate is fired, the stress applied between the wiring electrode 14 and the ceramic layer 12 is decentralized by the dot patterns 16, and the occurrence of cracking in the ceramic layer 12 or the occurrence of warping and deformation of the board are prevented. Moreover, preferably, a stress can be decentralized at every location at which the occurrence of cracking begins, by arranging the dot patterns 16 around the wiring electrode 14.

Figure 6:
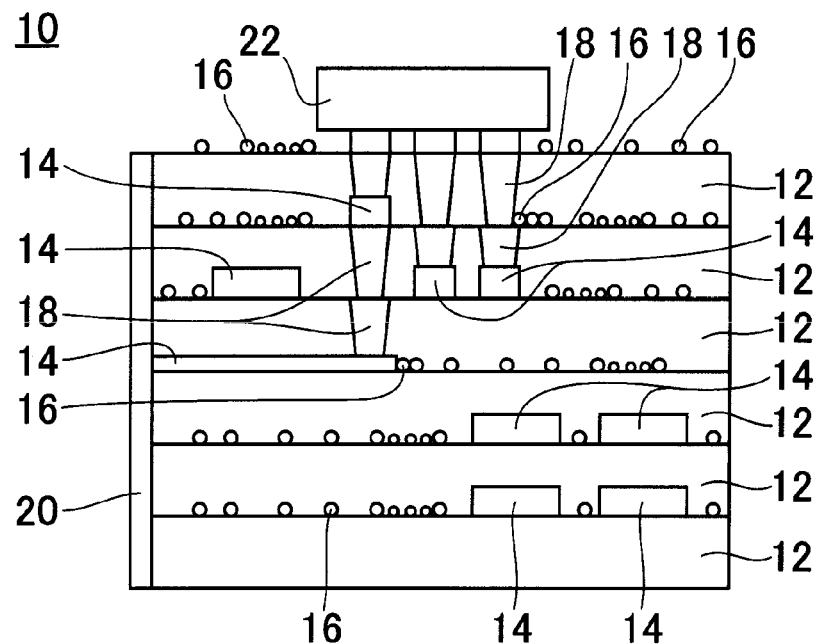
FIG. 6 is a sectional view showing a multilayer interconnection board according to another preferred embodiment of the present invention.
Figure 7:
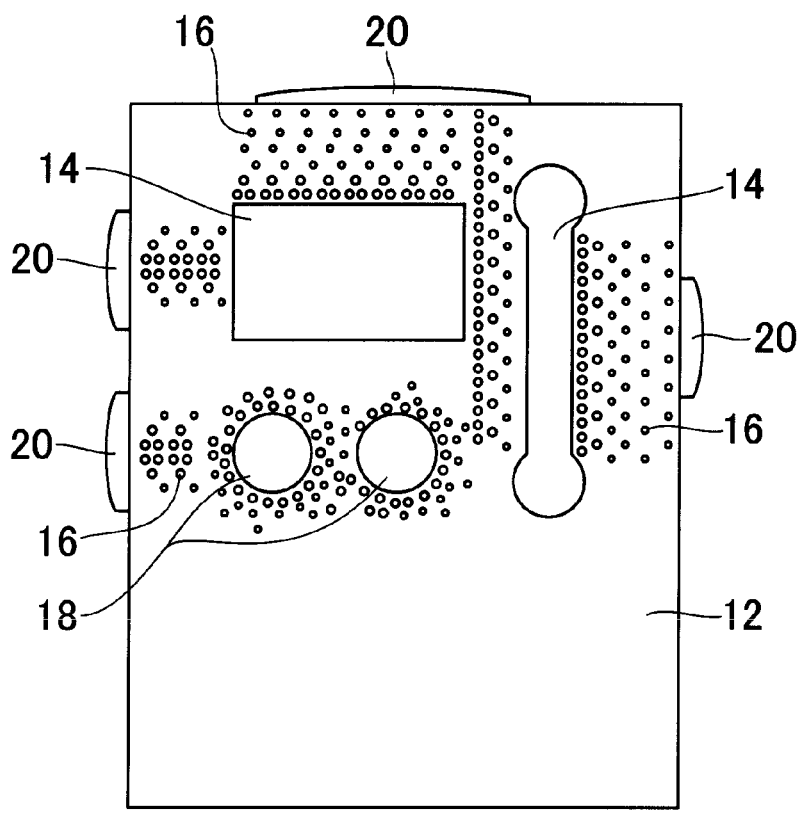
FIG. 7 is a plan view showing a ceramic layer of the multilayer interconnection board shown in FIG. 6.

In addition, as shown in FIG. 6 and FIG. 7, when via holes 18 are provided in the ceramic layers 12, dot patterns 16 can also be provided. Here, the via holes 18 are through holes provided in ceramic layers 12 that are filled with an electrically conductive material which are arranged to connect wiring electrodes 14 disposed on different ceramic layers 12 or to connect an electronic component mounted on the multilayer interconnection board 10 and a wiring electrode 14 provided the inside the multilayer interconnection board 10. In order to form the via hole 18, for example, a through hole is formed in a ceramic green sheet, and an electrically conductive paste is filled in the through hole. Then, the ceramic green sheets are laminated and fired, so that the via holes 18 are formed in the ceramic layers 12. In the multilayer interconnection board 10 shown in FIG. 6 and FIG. 7, the wiring electrodes 14 disposed in the internal ceramic layers 12 extend to side surfaces of the board and are connected to side surface electrodes 20 arranged on the side surfaces of the board. Among a plurality of side surface electrodes 20, at least one side surface electrodes 20 is preferably used as, for example, a ground electrode. Furthermore, another electronic component 22 is preferably mounted on an upper surface of the multilayer interconnection board 10 and is connected to the wiring electrodes 14 provided on the internal ceramic layers 12 through the via holes 18, for example.

In the multilayer interconnection board 10 provided with the via holes 18, the dot patterns 16 preferably have a size that is smaller than the two-dimensional size of the via hole 18. Consequently, the dot patterns 16 can preferably be arranged in gaps between the wiring electrodes 14 and the via holes 18. Therefore, locations of the wiring electrodes 14 and the via holes 18 can be freely designed without taking the locations the dot patterns 16 into consideration.

Furthermore, the dot patterns 16 are preferably disposed on the principal surface of the ceramic layer 12 and, thereby, heat can be transferred along the principal surface of the ceramic layer 12 through the dot patterns 16. Therefore, the heat in the inside of the multilayer interconnection board 10 can be transferred to the outside along the principal surface of each ceramic layer 12. Since the heat in the inside of the multilayer interconnection board 10 can be transferred and dissipated through a selective route to the outside, as described above, even when elements are disposed in the inside of the multilayer interconnection board 10, the transfer of the heat to these elements is prevented. Moreover, even when heat is generated from an element disposed in the inside of the multilayer interconnection board 10, since the heat can be transferred along the principal surface of the ceramic layer 12 and be dissipated, an influence of the heat is prevented from being exerted on the elements disposed on the other ceramic layers 12.

In addition, the dot patterns 16 may preferably be in contact with the via hole 18 in a manner similar to that of the dot patterns 16 between the first layer and the second layer of the multilayer interconnection board 10 shown in FIG. 6. Regarding such a multilayer interconnection board 10, for example, when the heat generated by the electronic component 22 transfers through the via hole 18, the heat can preferably be dissipated to the outside through the dot patterns 16 along the principal surface of the ceramic layer 12.

Furthermore, as shown in FIG. 6, the dot patterns 16 may preferably be in contact with the wiring electrode 14 connected to the side surface electrode 20 defining a ground electrode, for example. When the dot patterns 16 are in contact with the ground electrode, an electromagnetic shielding effect can preferably be obtained on both sides of the dot patterns 16. Therefore, electromagnetic coupling between elements disposed on different ceramic layers 12, between elements disposed on both sides of the dot patterns 16 on the same ceramic layer 12, or between wiring electrodes disposed on both sides of the dot patterns 16 can be prevented.

Figure 8:
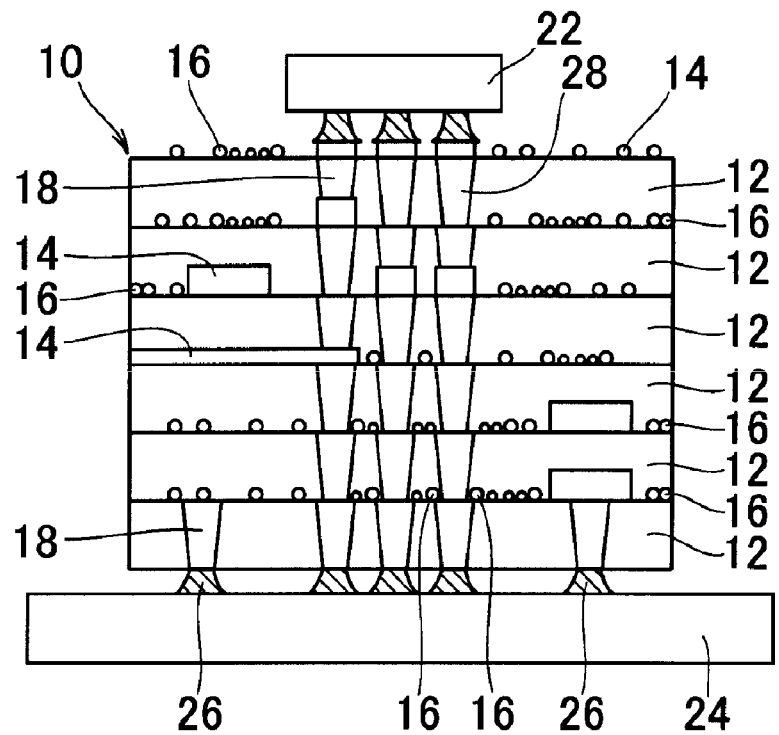
FIG. 8 is a sectional view showing a multilayer interconnection board according to another preferred embodiment of the present invention.

Moreover, as shown in FIG. 8, when the multilayer interconnection board 10 is connected to a printed circuit board 24 via solder 26, thermal vias 28 may preferably be provided to dissipate the heat generated by the electronic component 22 to the printed circuit board 24. In this case, the heat in the multilayer interconnection board 10 can be dissipated to the printed circuit board 24 through the thermal vias 28 by arranging the dot patterns 16 to be in contact with the thermal vias 28, for example. Therefore, a heat dissipation effect can preferably be improved by arranging the dot patterns 16 in contact with the thermal vias 28, for example.

In addition, as shown in FIG. 8, the dot patterns 16 may preferably be exposed at the side surface of the multilayer interconnection board 10. For example, in production of the multilayer interconnection board 10, when a large mother board including wiring electrodes 14 and the via holes 18 is produced and the resulting mother board is cut into individual multilayer interconnection boards 10, the dot patterns 16 are preferably exposed at the side surface of the multilayer interconnection board 10. When the dot patterns 16 are exposed at the side surface of the multilayer interconnection board 10, as described above, the heat inside the board is transferred through the dot patterns 16 and is dissipated from the exposed dot patterns 16. Therefore, the heat dissipation can be improved by exposing the dot patterns 16 at the side surfaces of the multilayer interconnection board 10.

Figure 9:
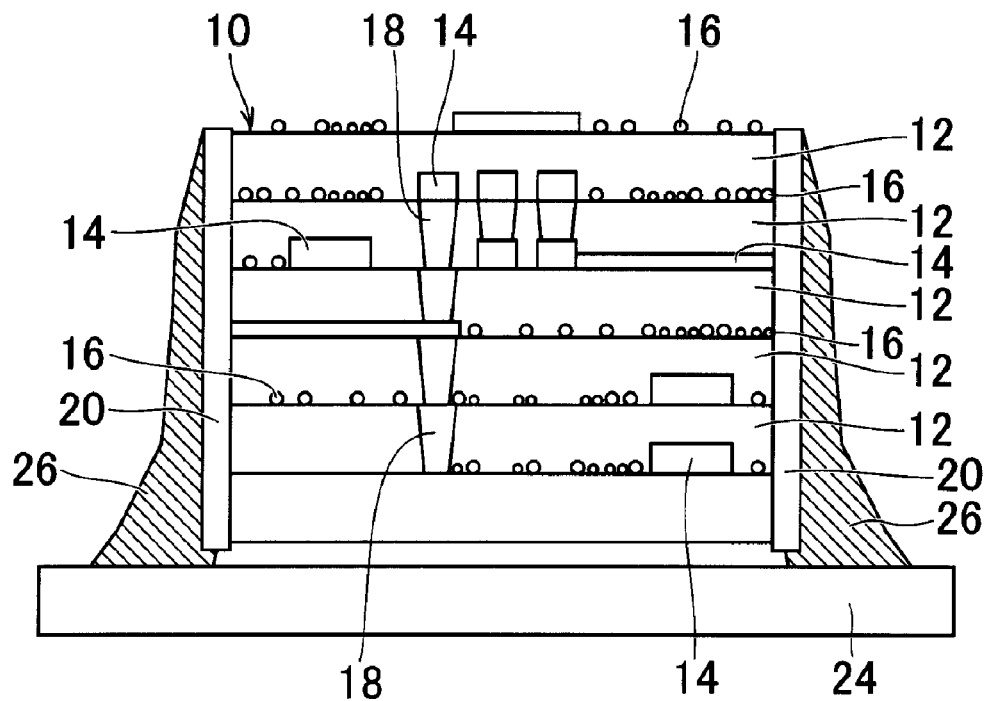
FIG. 9 is a sectional view showing a multilayer interconnection board according to another preferred embodiment of the present invention.

Furthermore, as shown in FIG. 9, in the configuration in which the side surface electrodes 20 are disposed on the side surfaces of the multilayer interconnection board 10 and the side surface electrodes 20 are connected to the printed circuit board 24 with solder 26, the dot patterns 16 may preferably be in contact with the side surface electrodes 20, for example. When the dot patterns 16 are in contact with the side surface electrodes 20, the heat inside the board can be transferred to the side surface electrodes 20 through the dot patterns 16 and the heat can be dissipated to the outside from the side surface electrodes 20. Therefore, the heat dissipation can be improved by arranging the dot patterns 16 in contact with the side surface electrodes 20.

Figure 10:
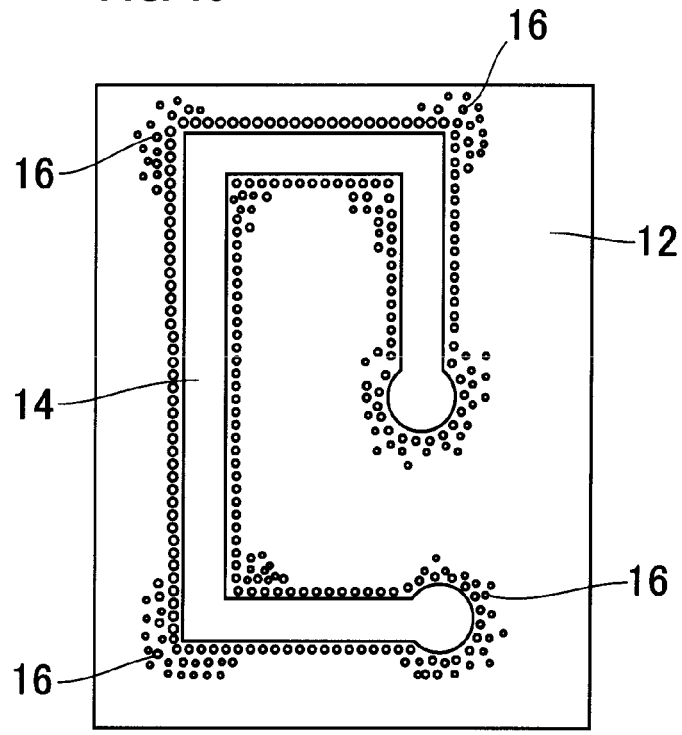
FIG. 10 is plan view of an example of an arrangement of dot patterns disposed on a ceramic layer.

In the multilayer interconnection boards 10, the dot patterns 16 are arranged around the wiring electrodes 14 on each ceramic layer 12. As shown in FIG. 10, the densities of the dot patterns 16 in the outside portions and inside portions of corner portions of the bent wiring electrode 14 are preferably relatively high. The stress caused by shrinkage during firing is concentrated in the vicinity of the corner portions of the bent wiring electrode 14. Therefore, the occurrence of cracking at locations at which the stress is concentrated can be easily suppressed by increasing the density of the dot patterns 16 in these portions.

Figure 11:
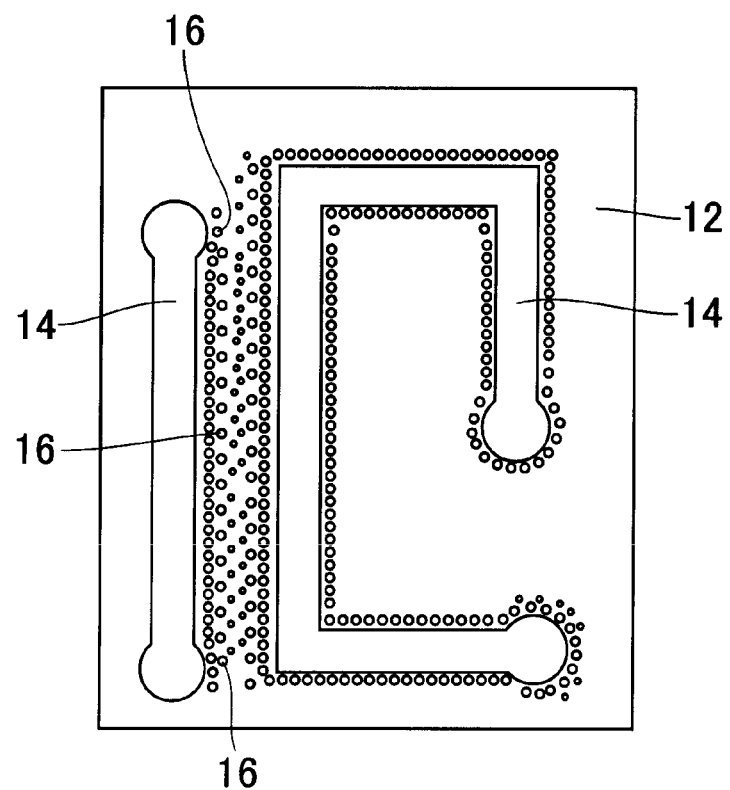
FIG. 11 is plan view of another example of an arrangement of dot patterns disposed on a ceramic layer.

In addition, as shown in FIG. 11, when adjacent wiring electrodes 14 are provided, the density of dot patterns 16 between the wiring electrodes 14 is preferably relatively high. When two wiring electrodes 14 are provided, the stress tends to be concentrated between the wiring electrodes 14. Consequently, an occurrence of cracking at location in which the stress is concentrated can be effectively prevented by increasing the density of the dot patterns 16 between the adjacent wiring electrodes 14.

Figure 12:
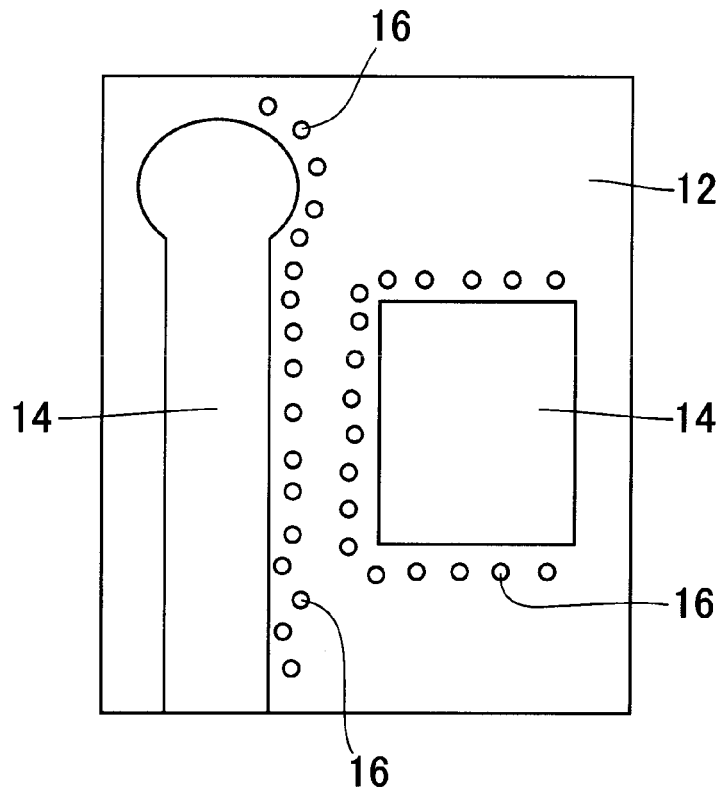
FIG. 12 is a plan view of an example of a shape of dot patterns disposed on a ceramic layer.
Figure 13:
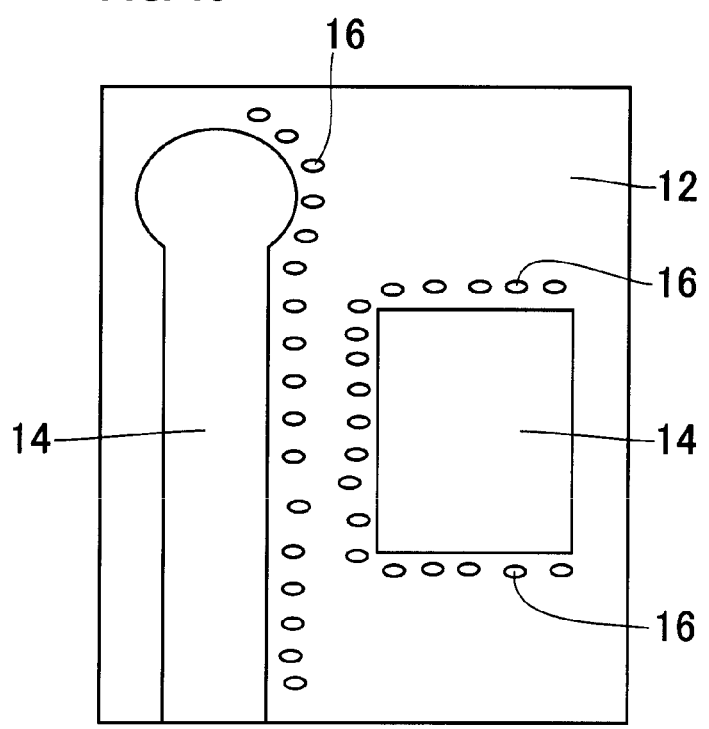
FIG. 13 is a plan view of another example of a shape of dot patterns disposed on a ceramic layer.
Figure 14:
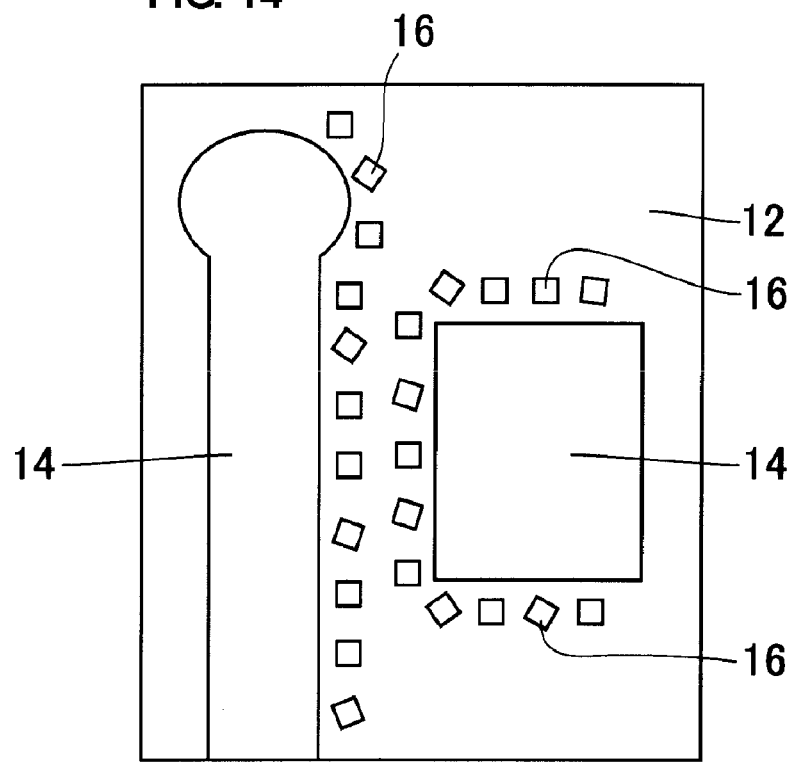
FIG. 14 is a plan view of another example of a shape of dot patterns disposed on a ceramic layer.
Figure 15:
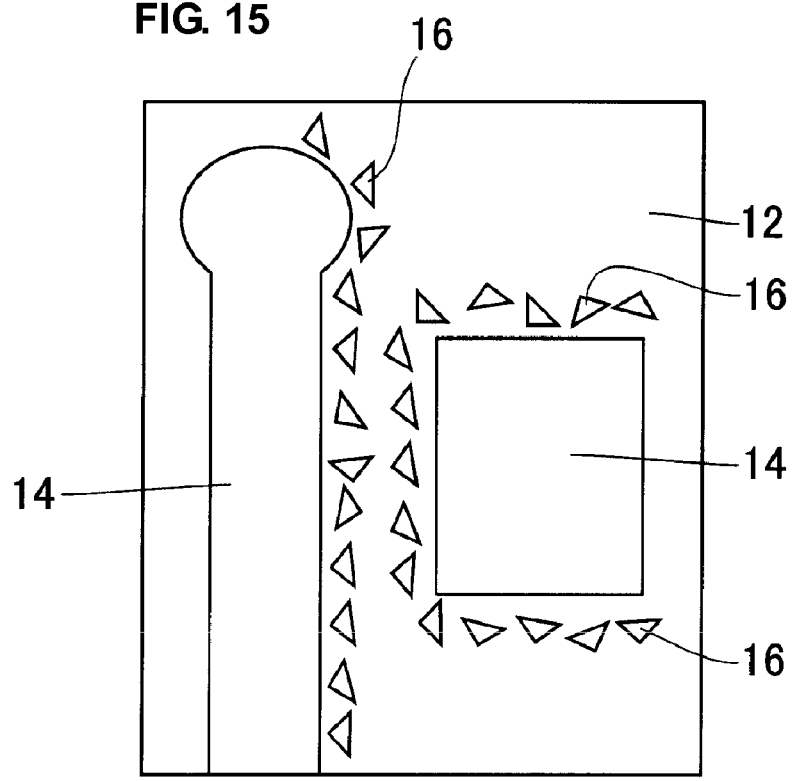
FIG. 15 is a plan view of another example of a shape of dot patterns disposed on a ceramic layer.

Preferably, the shape of the dot pattern 16 is circular or substantially circular as shown in FIG. 12 or elliptical or substantially elliptical as shown in FIG. 13, for example. When the dot pattern 16 includes a corner portion, the stress is concentrated in the vicinity corner portion. Therefore, the concentration of stress can be prevented by configuring the shape of dot pattern so as to have a substantially circular, e.g., a circle or an ellipse, for example. However, the multilayer interconnection board 10 is arranged to prevent stress applied to the ceramic layer 12 by scattering fine dot patterns 16 around the wiring electrode 14 or around the via hole 18. Therefore, even substantially quadrangular dot patterns 16 as shown in FIG. 14 or triangular dot patterns 16 as shown in FIG. 15, for example, can prevent an occurrence of cracking in the ceramic layer 12.

Figure 16:
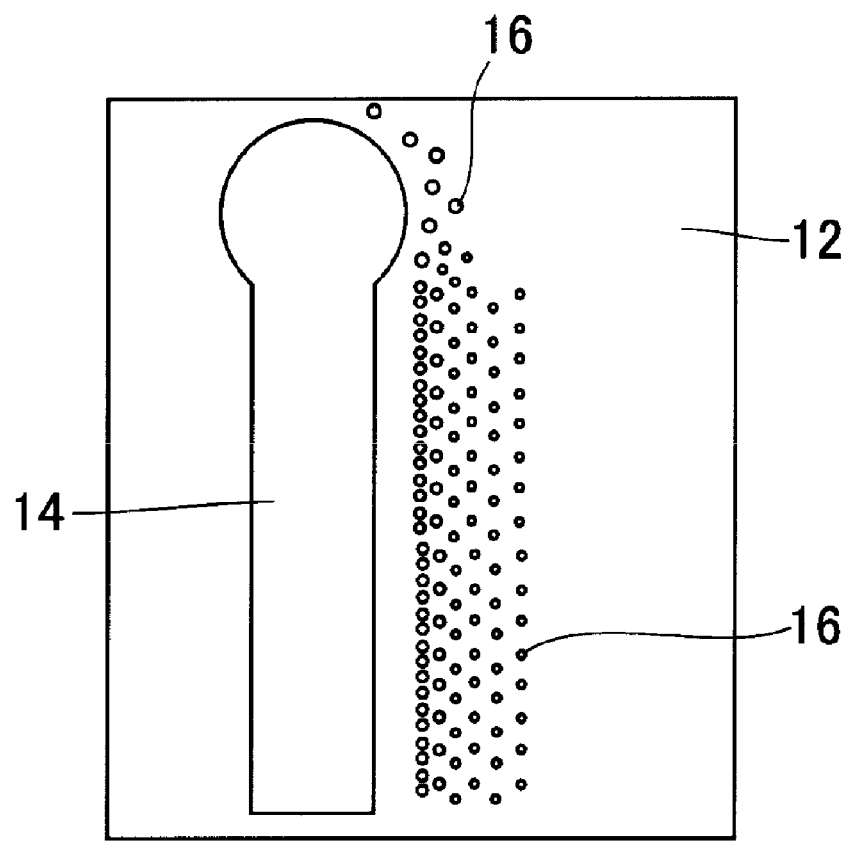
FIG. 16 is a plan view of another example of a shape of dot patterns disposed on a ceramic layer.
Figure 17:
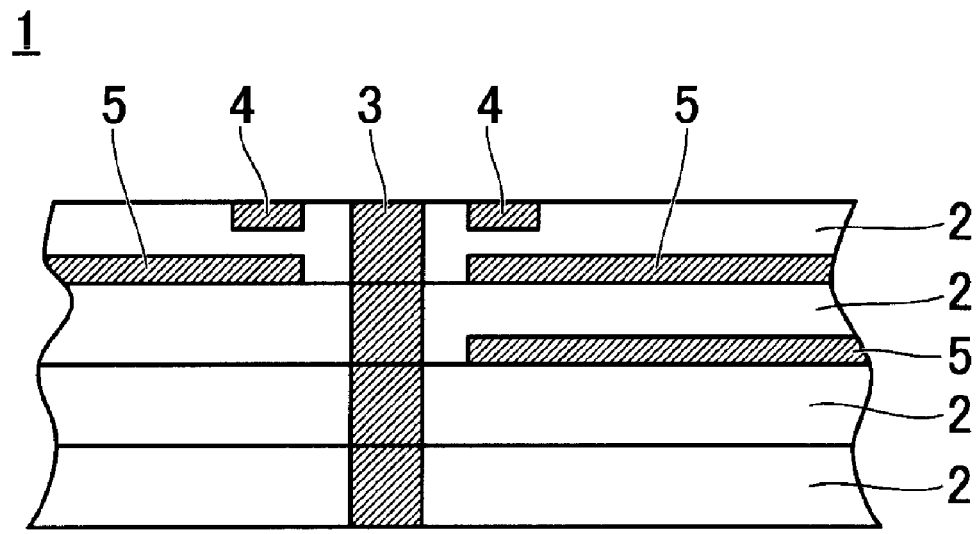
FIG. 17 is a sectional view showing an example of a multilayer interconnection board in the related art.

Furthermore, it is preferable that, as shown in FIG. 16, no dot pattern 16 is arranged immediately adjacent to a portion of the wiring electrode 14 and that a gap is provided between the wiring electrode 14 and the dot patterns 16. When such a gap is provided, even when there are variations in the line width of the wiring electrode 14, contact between the wiring electrode 14 and the dot patterns 16 is effectively prevented. The material used for the dot patterns 16 is not necessarily the same material as that for the wiring electrode 14, and instead, the dot patterns 16 may be made of a different material from that of the wiring pattern 14. For example, if magnetic materials, e.g., ferrite and magnetite, are used as the material for the dot patterns 16, an electromagnetic shielding effect can be provided. Here, in order to alleviate the stress between the wiring electrode 14 and the ceramic layer 12 by providing the dot patterns 16, it is preferable that the value of heat shrinkage of the dot pattern 16 is between the heat shrinkage of the wiring electrode 14 and the heat shrinkage of the ceramic layer 12, for example.

In order to produce a multilayer interconnection board 10, a screen printing method, for example, is preferably used. A ceramic slurry used as a material for the ceramic layer 12, for example, is preferably prepared. The ceramic slurry is used and a ceramic green sheet is formed on a carrier film preferably by a doctor blade method, for example. Subsequently, the ceramic green sheet is cut into a predetermined size together with the carrier film.

Next, laser light ($CO_2$ laser) with a controlled output is applied from the carrier film side and the carrier film and the ceramic green sheet are penetrated, so that a through hole is formed in the carrier film and the ceramic green sheet. Then, a conductor paste is filled into the through hole from the carrier film side, and an excess conductor paste is scraped and removed.

A wiring electrode 14 is formed on a sheet surface of the ceramic green sheet filled with the conductor paste preferably by a screen printing method, for example. An electrically conductive material included in the conductor paste is preferably at least one type of metal selected from the group consisting of Cu, Ni, Co, Ag, Pd, Rh, Ru, Au, Pt, and Ir, for example. Furthermore, these metals may be used alone or be used as alloys. Moreover, oxides of these metals may be used.

Dot patterns 16 are formed on the surface provided with the wiring electrode 14 of the ceramic green sheet preferably through screen printing, for example. The density of dot patterns 16 can be varied as desired preferably by a CAD pattern. Here, the density of dot patterns 16 refers to the proportion of the total area of the dot patterns 16 relative to the area of a portion of the ceramic green sheet in which no wiring electrode 14 is provided. The shape of the dot pattern 16 may be any suitable shape, e.g., a circle, an ellipse, a quadrangle, or a triangle, as described above. In addition, the material used for the dot patterns 16 may be the same material as that used for the wiring electrode 14 or a different material than that used for the wiring electrode 14, as described above. When the wiring electrode 14 and the dot patterns 16 are made of the same material, the wiring electrode 14 and the dot patterns 16 can be formed in the same step and, therefore, the cost can be reduced.

The formation of through holes, the filling of the conductor paste, the formation of the wiring electrodes 14, and the formation of the dot patterns 16 are performed on the ceramic greens sheet layers, and all layers are laminated and contact-bonded. Break grooves for splitting the resulting laminate into split boards defining multilayer interconnection boards 10 are formed in the laminate. The laminate is fired, and plating is applied to define external electrodes. Thereafter, ICs, surface-mounting components, and other components are mounted on the resulting mother board, and the mother board is split into split boards at the break groove portions, such that a plurality of multilayer interconnection boards 10 are produced.

With the resulting multilayer interconnection board 10, the occurrence of cracking in the ceramic layer, the occurrence of warping of the board, and the occurrence of other defects during firing can be effectively prevented. Moreover, the heat dissipation effect and the electromagnetic shielding effect can also be obtained by forming the dot patterns 16. Here, since the dot patterns 16 are preferably formed on the same layer as that of the wiring electrode 14, that is, between the laminated ceramic layers 12, no metal particle is included in the inside of the ceramic layer 12, and changes in the characteristics, e.g., a dielectric constant, a thermal conductivity, an electrical conductivity, and board strength of the board itself can preferably be minimized.

Furthermore, the dot patterns 16 only need to be arranged in marginal spaces between the wiring electrodes 14 and the via holes 18 and are not required to occupy a large area. Consequently, the dot patterns do not prevent an increase in the density of the wiring electrode 14 and the design flexibility is improved. In addition, the density distribution of the dot patterns 16 is preferably freely designed. Furthermore, the dot patterns 16 need not be thicker than the wiring electrode 14 and, therefore, the thickness of the multilayer interconnection board 10 is not increase. Moreover, when the screen printing method is used, the wiring electrode 14 and the dot patterns 16 can be produced using the same material in the same step. Therefore, increases in material and manufacturing costs are prevented.

It is well known that a metal defining a wiring electrode may diffuse into ceramic during firing. In this case, even when the dot pattern is not provided, a difference in shrinkage behavior between the wiring electrode and the ceramic around the wiring electrode is reduced and it is assumed that cracking may be prevented. However, there are situations in which a wiring electrode material does not diffuse into the ceramic, depending on the combination of the wiring electrode material and the ceramic. In addition, a firing profile is restricted to some extent in order to diffuse the wiring electrode material into the ceramic. On the other hand, when the dot patterns 16 are provided, cracking can be prevented regardless of the combination of the materials and the firing profile. Therefore, the combination of the materials and the like can be freely designed.

Alternatively, the dot patterns 16 can preferably be formed by the ink-jet printing method, for example. For this purpose, in a manner similar to that described above, ceramic green sheets provided with the wiring electrodes 14 preferably formed by screen printing, for example, are prepared. Ink used for the ink-jet printing is prepared. For example, an ink including about 3 parts by weight of Cu particles having an average particle diameter of about 100 nm are added to about 100 parts by weight of IPA (isopropyl alcohol) and a dispersing agent is added thereto, so that an ink for dot patterns is produced.

The material used for the dot patterns included in the ink may preferably be the same material as that for the wiring electrode 14 or may preferably be a different type of material. When the material used for the wiring electrode 14 and the material used for the dot patterns are the same material, a transition metal group, e.g., Cu, Ni, Co, Ag, Pd, Rh, Ru, Au, Pt, or Ir, for example, is preferred used as the material for the dot patterns. In the present example, Cu is preferably used. However, when Ag is used, finer nanoparticles can be used.

The average particle diameter of the material used for the dot patterns is preferably about 10 nm to about 1 µm, for example. If the average particle diameter exceeds about 1 µm, a problem occurs in that an ink-jet nozzle may get clogged. Furthermore, it is preferable that the concentration of the material used for the dot patterns in the ink is about 70 percent by weight or less, for example, and more preferably about 50 percent by weight or less, for example. If the concentration of the material used for the dot patterns exceeds about 70 percent by weight, ink characteristics, e.g., the viscosity and the surface tension, are unsatisfactory and, thereby, the ink cannot be used as the ink-jet ink. Moreover, it is preferable that the viscosity of the dot pattern ink is within the range of about 1 mPa·s to about 100 mPa·s, for example, and the surface tension is within the range of about 25 mN/m to about 80 mN/m, for example. Outside of these ranges, the ink characteristics for the ink-jet ink are unsatisfactory.

In addition, instead of IPA, the solvent may preferably be long-chain alkanes, e.g., hexane, heptane, octane, decane, undecane, dodecane, tridecane, and trimethylpentane; cycloalkanes, e.g., cyclohexane, cycloheptane, and cyclooctane; aromatic hydrocarbons, e.g., benzene, toluene, xylene, trimethylbenzene, and dodecylbenzene; and alcohols, e.g., hexanol, heptanol, octanol, decanol, cyclohexanol, and terpineol, can be used. These solvents may be used alone or in a mixed solvent.

The resulting dot pattern ink is used, and fine dot patterns 16 are formed through ink-jet printing on the ceramic green sheet surface, on which the wiring electrode 14 is formed by screen printing, so as to surround the wiring electrode 14. Thereafter, lamination of the ceramic green sheets, firing, mounting of electronic components, splitting of the mother board, and other process are performed.

Here, a method in described in which the content of the material used for the dot patterns in the dot pattern ink is adjusted in order to vary the density distribution of dot patterns 16. The density of the dot patterns 16 can preferably be increased by increasing the content of material used for the dot patterns, for example. Alternatively, the adjustment can preferably be performed by the size (amount of discharge) of ink particles ejected from an ink-jet nozzle, for example. The density of the dot patterns 16 can preferably be increased by increasing the amount of discharge of ink, for example. Alternatively, overprinting of the dot patterns 16 may be performed. The density of the dot patterns 16 can preferably be increased by increasing the number of overprinting, for example.

When the dot patterns 16 are formed by the ink-jet printing method, as described above, effects, e.g., prevention of cracking, heat dissipation, and electromagnetic shielding can be obtained, similarly to when the dot patterns 16 are formed by the screen printing method. In this regard, the wiring electrode 14 is not necessarily formed through screen printing, and both the wiring electrode 14 and the dot patterns 16 may preferably be formed by ink-jet printing, for example.

Alternatively, the wiring electrode 14 and the dot patterns 16 may be formed using an electrophotographic printing method. For that purpose, a chargeable powder for forming the wiring electrode 14 and the dot patterns 16 is produced. In order to form the chargeable powder, a copper powder and a resin are preferably mixed, for example, and the copper powder surface is coated with the resin using a surface treatment machine. The resulting sample is classified, and a fine powder and a coarse powder are removed. The obtained capsule copper powder and an external additive are mixed, and the external additive is adhered to the surface of the capsule copper powder uniformly using a surface treatment machine. Subsequently, a developer is obtained by mixing the capsule copper powder, to which the adhesive has been adhered, and the carrier.

It is preferable that the electrically conductive material defining the toner is at least one type of metal selected from the group consisting of a transition metal group of Cu, Ni, Ag, Pd, Rh, Ru, Au, Pt, Ir, for example. The metals may be used alone or be used as an alloy. Furthermore, oxides of these metals may be used.

It is preferable that the average particle diameter of the electrically conductive material defining the toner is within the range of about 0.05 µm to about 10 µm, for example, and a more preferable within a range of about 0.1 µm to 5 about µm, for example. If the average particle diameter of the electrically conductive material exceeds about 10 µm, the diameter of toner particle becomes large and it is difficult to form a fine wiring electrode 14. If the particle diameter of the electrically conductive material is less than about 0.05 µm, aggregation easily occurs during coating with the resin and, therefore, a toner having good chargeability cannot be obtained.

Moreover, it is preferable that the average particle diameter of the toner is within the range of about 1 µm to 30 µm, for example, and more preferably within the range of about 5 µm to about 10 µm, for example. If the average particle diameter of the toner exceeds about 30 µm, it becomes difficult to form a fine wiring electrode 14. If the average particle diameter becomes less than about 1 µm, the amount of charge per toner particle decreases and edge reproducibility of the wiring electrode 14 deteriorates.

It is preferable that the content of the electrically conductive material is within the range of about 10 to about 95 percent by weight, and more preferably within the range of about 80 to about 95 percent by weight. If the content of the electrically conductive material exceeds about 95 percent by weight, the resin in the toner is reduced, the electrically conductive material is exposed at the surface, and the chargeability deteriorates. If the content of the electrically conductive material becomes less than about 10 percent by weight, the resistance of the wiring electrode 14 after firing is significantly increased.

The resulting toner is used and the wiring electrode 14 is formed on the ceramic green sheet by the electrophotographic printing method. For that purpose, a photosensitive member of the electrophotographic printer is uniformly charged. Then, light from an LED is applied to the charged photosensitive member, so that a latent image in the shape of a wiring electrode is formed. Furthermore, the developer disposed on a developing sleeve is brought into contact with the photosensitive member and a developing bias is applied, so that the toner has a latent image in the shape of the wiring electrode on the photosensitive member.

The photosensitive member provided with the toner is stacked on a ceramic green sheet, and the toner is transferred to the ceramic green sheet. Subsequently, the ceramic green sheet to which the toner has been transferred in the shape of the wiring electrode is disposed into an oven so as to fix the toner and, thereby, the ceramic green sheet provided with the wiring electrode 14 is obtained.

Next, the dot patterns 16 are formed on the ceramic green sheet. For this purpose, a photosensitive member of the electrophotographic printer is uniformly charged. Then, light from an LED is applied to the charged photosensitive member, so that a latent image in the shape of dot patterns is provided. At this time, the density of the dot patterns 16 is designed so as to become the greatest in the vicinity of the wiring electrode 14 and to decrease gradually with increasing distance from the wiring electrode 14. Furthermore, the developer disposed on a developing sleeve is brought into contact with the photosensitive member and a developing bias is applied, so that the toner having a latent image in the shape of dot patterns is provided on the photosensitive member.

The photosensitive member provided with the developed dot patterns is stacked on the ceramic green sheet provided with the wiring electrode 14, and the toner is transferred to the ceramic green sheet with the wiring electrode. Subsequently, the ceramic green sheet, to which the toner has been transferred in the shape of the dot patterns, with the wiring electrode is disposed in an oven so as to fix the toner and, thereby, the ceramic green sheet provided with the wiring electrode 14 and the dot patterns 16 can be obtained. At this time, the dot patterns 16 are isolated and insulated from each other and, in addition, are separated and insulated from the wiring electrode 14.

Incidentally, the wiring electrode 14 and the dot patterns 16 are preferably produced by a two-component development system, for example. However, the formation can also be performed by a dry one-component development system, a wet development system, or other suitable method. Furthermore, in the above-described example, the density of the dot patterns 16 in the vicinity of the wiring electrode 14 is specified to be relatively high. However, when the density of the dot patterns 16 immediately adjacent to the wiring electrode 14 is specified to be zero, even when there are variations in wiring electrode width, contact between the wiring electrode 14 and the dot patterns 16 can be prevented.

Thereafter, lamination of the ceramic green sheets, firing, mounting of electronic components, splitting of the mother board, and other processes are preferably performed. They are performed in a manner similar to those in the method using screen printing. Even when the dot patterns 16 are formed by the electrophotographic printing method, as described above, effects, such as prevention of cracking, heat dissipation, and electromagnetic shielding can be obtained. In this regard, the wiring electrode 14 may preferably be formed by screen printing and the dot patterns 16 may preferably be formed by electrophotographic printing.

In the formation of the dot patterns by the electrophotographic printing method, for example, the density distribution of the dot patterns 16 can preferably be adjusted in the design with CAD, for example. Furthermore, the density of the dot patterns 16 can be increased by increasing the development bias when the toner disposed on the photosensitive member has the latent image. This is because the force of an electric field, which moves the toner to the photosensitive member, is increased. Moreover, the density of the dot patterns 16 can be increased by increasing the toner concentration. This is because the amount of toner fed to the photosensitive member is increased. In addition, the density of the dot patterns 16 can be increased by increasing the peripheral speed ratio of the developing sleeve to the photosensitive member. This is because the peripheral speed of the developing sleeve is increased as compared to the peripheral speed of the photosensitive member and, thereby, the amount of the toner fed to the photosensitive member is increased. Furthermore, the density of the dot patterns 16 can be increased by increasing the content of the dot pattern material in the toner. In the above-described examples, the density of the dot patterns 16 can be increased by increasing the proportion of the electrically conductive material defining the toner.

The description above describes methods for forming the wiring electrode 14 and the dot patterns 16 through screen printing, ink-jet printing, and electrophotographic printing. However, the wiring electrode 14 and the dot patterns 16 can preferably be formed using other methods, for example, pattern forming methods through thermal transfer printing, gravure printing, direct drawing printing, and the like in the related art.

EXAMPLE 1

A multilayer interconnection board which exhibits a difference in shrinkage behavior between the ceramic and the wiring electrode material and in which defect can be easily detected was produced as a sample for checking for cracking. Specifically, a sample was produced, in which 30 layers of thin ceramic green sheets having a thickness of about 10 μm were continuously laminated. A wiring electrode having a thickness greater than a usual thickness was formed on each ceramic green sheet. The produced laminate was fired, and cracking was checked by observing a cross-section thereof. Furthermore, a check of the heat dissipation performance was performed using the sample for checking cracking. Specifically, about 0.3 A of current was passed through the wiring electrode and a temperature increase of a sample upper surface was measured.

Moreover, a coupler which included wiring electrodes opposed to each other on the ceramic layer and which was subjected to side edge coupling was produced as a sample for checking electromagnetic coupling. The width of the opposed wiring electrodes was specified to be about 100 μm, and the gap between the wiring electrodes was specified to be about 30 μm such that the degree of electromagnetic coupling was improved. In addition, a ground electrode was formed on the sample and the dot patterns were connected to the ground electrode. The check of an electromagnetic shielding effect was performed based on the degree of electromagnetic coupling of the coupler. Furthermore, an insulation resistance (IR) was measured using the sample for checking electromagnetic coupling.

According to the check of these samples, as the density distribution of the dot patterns was varied, the crack preventing effect, the heat dissipation effect, and the electromagnetic shielding effect between lines were all improved. These effects are provided when the density of the dot patterns is at least about 3%, for example. Furthermore, the insulation resistance (IR) between the wiring electrodes decreases as the density of the dot patterns increases. If the density of the dot patterns exceeds about 60%, short-circuiting occurs between the wiring electrodes and, thereby, the functionality of an electronic component is destroyed. Consequently, the density of the dot patterns, in which the multilayer interconnection board can be favorably used as an electronic component, is preferably within the range of about 3% to about 60%, for example.

Moreover, it was noted that the cracking prevention effect when the shape of the dot pattern was substantially circular or substantially elliptical was greater than the effect when the shape was polygonal, e.g., triangular or quadrangular. The reason for this is believed to be that when the dot pattern has a corner portion, a stress caused by a difference in shrinkage between the ceramic and the dot pattern is concentrated at the corner portion. Therefore, it is preferable that the shape of the dot pattern is substantially circular or substantially elliptical, for example.

In addition, it was noted that if the size of the dot pattern is about 20 μm or more, the cracking prevention effect was reduced. The reason for this is believed to be that if the size of the dot pattern is large, the absolute value of the difference in shrinkage between the ceramic and the dot pattern is large and, thereby, a stress applied to the periphery of the dot pattern is large. Furthermore, if the size of the dot pattern is about 0.05 μm or less, the cracking prevention effect was also reduced. The reason for this is believed to be that the shrinkage behavior of the ceramic becomes excessively predominant and, thereby, the difference in shrinkage cannot be alleviated. Therefore, the average particle diameter of the dot pattern is preferably within the range of about 0.05 μm to about 20 μm, for example.

Moreover, when the dot patterns were arranged to substantially surround the wiring electrode, the crack preventing effect, the heat dissipation effect, and the electromagnetic shielding effect between the wiring electrodes were all improved. In addition, when a gradient was provided in the density distribution of the dot patterns such that the density of the dot patterns in the vicinity of the wiring electrode was high and the density of the dot patterns was reduced with increasing distance from the wiring electrode, the cracking prevention effect was further improved. The reason for this is believed to be that a difference in shrinkage behavior between the ceramic and the wiring electrode material does not become too large.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer interconnection board comprising:
   a plurality of laminated ceramic layers;
   wiring electrodes disposed on an upper principal surface of each of at least two of the plurality of laminated ceramic layers; and
   dot patterns defined by a plurality of dots scattered in the vicinity of the wiring electrodes on the upper principal surface of each of the at least two of the plurality of ceramic layers; wherein
   none of the plurality of dots on the upper principal surface of a first ceramic layer of the at least two of the plurality of laminated ceramic layers are arranged to overlap any of the wiring electrodes disposed on the upper principal surface of the first ceramic layer in a lamination direction of the plurality of laminated ceramic layers; and
   each of the plurality of dots is disposed on the upper principal surface of one of the at least two of the plurality of ceramic layers and none of the plurality of dots extend entirely through any of the at least two of the plurality of ceramic layers.

2. The multilayer interconnection board according to claim 1, wherein a density distribution of the dot patterns is varied.

3. The multilayer interconnection board according to claim 2, wherein the density distribution of the dot patterns is varied such that a ratio of a presence of the dot patterns in the vicinity of the wiring electrodes is relatively large and the ratio of the presence of the dot patterns becomes relatively smaller as a distance from the wiring electrodes increases.

4. The multilayer interconnection board according to claim 3, wherein the density distribution of the dot patterns is varied such that the dot patterns are smaller as the distance from the wiring electrodes increases.

5. The multilayer interconnection board according to claim 3, wherein the density distribution of the dot patterns is varied such that a number of dot patterns is reduced as the distance from the wiring electrodes increases.

6. The multilayer interconnection board according to claim 1, wherein the dot patterns are made of the same material as that for the wiring electrodes.

7. The multilayer interconnection board according to claim 1, wherein the dot patterns are made of a material different from a material from which the wiring electrodes are made.

8. The multilayer interconnection board according to claim 1, wherein a via hole disposed in the plurality of laminated ceramic layers is included and areas of individual ones of the dot patterns are smaller than an area of the via hole.

9. The multilayer interconnection board according to claim 1, wherein a via hole disposed in the plurality of laminated ceramic layers is included and at least one of the dot patterns is connected to the via hole.

10. The multilayer interconnection board according to claim 1, wherein a side surface electrode disposed on a side surface of the plurality of laminated ceramic layers is included and at least one of the dot patterns is connected to the side surface electrode.

11. The multilayer interconnection board according to claim 1, wherein a ground electrode is included and at least one of the dot patterns is connected to the ground electrode.

12. The multilayer interconnection board according to claim 1, wherein a two-dimensional shape of the dot pattern is substantially circular.

13. The multilayer interconnection board according to claim 1, wherein a value of heat shrinkage of the dot patterns is between a value of heat shrinkage of the ceramic layer and a value of heat shrinkage of the wiring electrodes.

14. The multilayer interconnection board according to claim 1, wherein the dot patterns are formed by a screen printing method.

15. The multilayer interconnection board according to claim 1, wherein the dot patterns are formed by an ink-jet printing method.

16. The multilayer interconnection board according to claim 1, wherein the dot patterns are formed by an electrophotographic printing method.

* * * * *